(12) United States Patent
Zhang et al.

(10) Patent No.: US 11,510,323 B2
(45) Date of Patent: Nov. 22, 2022

(54) CONDUCTIVE LAMINATED STRUCTURE, A MANUFACTURING METHOD THEREOF, AND A DISPLAY PANEL

(71) Applicant: YUNGU (GU'AN) TECHNOLOGY CO., LTD., Langfang (CN)

(72) Inventors: Yu Zhang, Langfang (CN); Suhua Li, Langfang (CN); Peng Wang, Langfang (CN); Dong Ding, Langfang (CN); Hailiang Liu, Langfang (CN)

(73) Assignee: YUNGU (GU'AN) TECHNOLOGY CO., LTD., Langfang (CN)

( * ) Notice: Subject to any disclaimer, the term of this patent is extended or adjusted under 35 U.S.C. 154(b) by 474 days.

(21) Appl. No.: 16/718,216

(22) Filed: Dec. 18, 2019

(65) Prior Publication Data

US 2020/0128679 A1    Apr. 23, 2020

Related U.S. Application Data

(63) Continuation of application No. PCT/CN2018/119005, filed on Dec. 3, 2018.

(30) Foreign Application Priority Data

Jun. 30, 2018    (CN) .......................... 201810704602.3

(51) Int. Cl.
*B32B 3/10*    (2006.01)
*H05K 3/38*    (2006.01)
(Continued)

(52) U.S. Cl.
CPC .............. *H05K 3/386* (2013.01); *H01B 5/14* (2013.01); *H01L 27/28* (2013.01); *H05K 1/0296* (2013.01);
(Continued)

(58) Field of Classification Search
None
See application file for complete search history.

(56) References Cited

U.S. PATENT DOCUMENTS 9,268,446 B2    2/2016  Gao
2008/0277157 A1*  11/2008  Naito .................... H01F 41/34
                                                        29/829
(Continued)

FOREIGN PATENT DOCUMENTS

CN          104020888 A     9/2014
CN          105183246 A    12/2015
(Continued)

OTHER PUBLICATIONS

CN Rejection Decision dated Jan. 21, 2020 in the corresponding CN application (application No. 201810704602.3).
(Continued)

*Primary Examiner* — Seth Dumbris
(74) *Attorney, Agent, or Firm* — Kilpatrick Townsend & Stockton

(57) ABSTRACT

The present application discloses a conductive laminated structure, a manufacturing method thereof, and a display panel. The conductive laminated structure provided by the present application comprises a substrate; an adhesion enhancement layer disposed on the substrate; a metal nanowire layer disposed on the adhesion enhancement layer and having a first opening to expose the adhesion enhancement layer; a wiring layer disposed on the metal nanowire layer and having a second opening at least partially overlapping the first opening to expose the adhesion enhancement layer; and an optical adhesive layer disposed on the wiring layer, filled in the second opening and the first opening and connected to the adhesion enhancement layer. Because the metal nanowire layer is in direct contact with (Continued)

the wiring layer, the conducting capability is enhanced, and a reduced contacting area is needed, so that the wiring layer can be relatively narrow.

20 Claims, 14 Drawing Sheets

(51) Int. Cl.
*H01B 5/14* (2006.01)
*H05K 1/02* (2006.01)
*H05K 1/09* (2006.01)
*H01L 27/28* (2006.01)

(52) U.S. Cl.
CPC .............. *H05K 1/09* (2013.01); *H05K 3/382* (2013.01); *H05K 3/388* (2013.01)

(56) References Cited

U.S. PATENT DOCUMENTS

| | | | |
|---|---|---|---|
| 2013/0056876 A1 | 3/2013 | Harvey et al. | |
| 2014/0353003 A1 | 12/2014 | Gu et al. | |
| 2017/0003774 A1* | 1/2017 | Iwata | G06F 3/041 |
| 2017/0188456 A1* | 6/2017 | Cho | H05K 1/09 |
| 2017/0228071 A1 | 8/2017 | Yoon et al. | |

FOREIGN PATENT DOCUMENTS

| | | |
|---|---|---|
| CN | 105204695 A | 12/2015 |
| CN | 105224150 U | 1/2016 |
| CN | 106575181 A | 4/2017 |
| CN | 107622990 A | 1/2018 |
| CN | 107943355 A | 4/2018 |
| CN | 207397244 U | 5/2018 |
| CN | 108899110 A | 11/2018 |
| KR | 20130107789 A | 10/2013 |

OTHER PUBLICATIONS

International Search Report dated Apr. 1, 2019 in the corresponding international application (application No. PCT/CN2018/119005).
Notice of Desicion to Grant of Korean Application No. 10-2020-7008648 dated Sep. 2, 2021.
Written Opinion for application No. PCT/CN2018/119005.
First Office Action of Chinese Application No. 201810704602.3.
Second Office Action of Chinese Application No. 201810704602.3.

* cited by examiner

CONDUCTIVE LAMINATED STRUCTURE, A MANUFACTURING METHOD THEREOF, AND A DISPLAY PANEL

CROSS-REFERENCES TO RELATED APPLICATIONS

The present application is a continuation application to PCT Application No. PCT/CN2018/119005, filed Dec. 3, 2018, which claims priority to Chinese Patent Application No. 201810704602.3, filed Jun. 30, 2018. Both applications are incorporated by reference herein for all purposes.

TECHNICAL FIELD

The present application relates to the field of metal nanowire material and its use.

BACKGROUND

At present, transparent conducting material comprises mainly indium tin oxide (ITO), which has excellent light transmittance and electrical conductivity.

SUMMARY

The inventors of the present application found out that, because metal nanowires contact the wirings through optical adhesive, there is a certain restriction on the contacting area between the nanowires and the wirings, which causes the bezel to be relatively wide. Thus, a purpose of the present application is to provide a conductive laminated structure and a manufacturing method thereof in order to realize a narrow bezel design.

Besides, the inventors of the present application also found out that, because of the material properties of metal nanowires, the metal nanowires have poor adhesive force. Thus, another purpose of the present application is to provide a conductive laminated structure and a manufacturing method thereof in order to increase the adhesive force of the metal nanowires.

In order to solve the above technical problems, the embodiments of the present application provide a conductive laminated structure, comprising:
  a substrate;
  an adhesion enhancement layer, disposed on the substrate;
  a metal nanowire layer, disposed on the adhesion enhancement layer and having a first opening to expose the adhesion enhancement layer;
  a wiring layer, disposed on the metal nanowire layer and having a second opening at least partially overlapping the first opening to expose the adhesion enhancement layer; and
  an optical adhesive layer, disposed on the wiring layer, filled in the second opening and the first opening and connected to the adhesion enhancement layer.

In an embodiment, as for the conductive laminated structure, the second opening has an area larger than that of the first opening; the first opening falls within the scope of the second opening.

In an embodiment, as for the conductive laminated structure, the second opening has an area smaller than that of the first opening; the second opening falls within the scope of the first opening.

In an embodiment, as for the conductive laminated structure, at least part of the first opening is misaligned with at least part of the second opening.

In an embodiment, the first opening has an area equal to that of the second opening, and the first opening has a boundary consistent with that of the second opening.

In an embodiment, as for the conductive laminated structure, multiple metal nanowire layers are formed on the substrate, each of the metal nanowire layers has an annular shape from a top view of the substrate, and the annular shape has a central opening that forms the first opening.

In an embodiment, as for the conductive laminated structure, the annular shape has an edge width of 0.5 μm-1.2 μm.

In an embodiment, as for the conductive laminated structure, the adhesion enhancement layer has a thickness of 10 nm-300 nm.

In an embodiment, as for the conductive laminated structure, it comprises multiple first openings and second openings.

In an embodiment, as for the conductive laminated structure, the adhesion enhancement layer is made of at least one material selected from high-molecular polymer, insulation material, resin, transparent optical adhesive, oxides, and photoresist analogues.

In an embodiment, as for the conductive laminated structure, the adhesion enhancement layer has a thickness of 10 nm-300 nm.

The embodiments of the present application also provide a method for manufacturing a conductive laminated structure, comprising:
  providing a substrate;
  forming an adhesion enhancement layer on the substrate;
  forming a metal nanowire layer on the adhesion enhancement layer;
  forming a wiring layer on the metal nanowire layer; and
  forming an optical adhesive layer on the wiring layer;
  wherein the metal nanowire layer has a first opening to expose the adhesion enhancement layer, the wiring layer has a second opening at least partially overlapping the first opening to expose the adhesion enhancement layer, and the optical adhesive layer is filled in the second opening and the first opening and connected to the adhesion enhancement layer.

In an embodiment, as for the method for manufacturing a conductive laminated structure, the step of forming the metal nanowire layer on the adhesion enhancement layer comprises:
  coating a solution of metal nanowires;
  drying to evaporate a solvent of the solution of metal nanowires, thereby obtaining a metal nanowire material layer;
  etching the metal nanowire material layer to form the first opening to expose the adhesion enhancement layer, so as to form the metal nanowire layer.

In an embodiment, the solution of metal nanowires has a plurality of metal nanowires distributed in the solvent.

In an embodiment, the solution of metal nanowires has a concentration of 0.01 mg/mL-10 mg/mL.

In an embodiment, the solvent is any one of water, ionic solution, salt-containing solution, supercritical fluid, and oil.

In an embodiment, the solvent contains at least one of a dispersing agent, a surfactant, a crosslinking agent, a wetting agent, and a thickening agent.

In an embodiment, in the step of drying to evaporate the solvent of the solution of metal nanowires, the drying is performed by vacuum decompression, infrared heating or hot air heating, and the drying lasts for a duration of 50 s-100 s.

The embodiments of the present application also provide a display panel, comprising the aforementioned conductive laminated structure.

In an embodiment, the display panel comprises a wiring region, a plurality of the metal nanowire layers are disposed in the wiring region and aligned in an extending direction of the wiring region.

The conductive laminated structure provided by the present application comprises a substrate; an adhesion enhancement layer disposed on the substrate; a metal nanowire layer disposed on the adhesion enhancement layer and having a first opening to expose the adhesion enhancement layer; a wiring layer disposed on the metal nanowire layer and having a second opening at least partially overlapping the first opening to expose the adhesion enhancement layer; and an optical adhesive layer disposed on the wiring layer, filled in the second opening and the first opening and connected to the adhesion enhancement layer. Because the metal nanowire layer is in direct contact with the wiring layer, the conducting capability is enhanced, and a reduced contacting area is needed, so that the wiring layer can be relatively narrow, and the design of a narrow bezel can be realized; in the meantime, by means of the adhesion enhancement layer, the adhesive force of the metal nanowire layer can be increased, and with the optical adhesive layer disposed in the openings, the fixing effect to the metal nanowire layer can also be increased, thereby also increasing the adhesive force.

Furthermore, by adjusting the sizes of and the positional relationship between the first opening and the second opening, the first opening and the second opening can be in form of a stepped shape, so as to increase the bonding area of the optical adhesive layer with the metal nanowire layer and the wiring layer, thereby increasing the bonding force to better increase the adhesive force for the metal nanowire layer.

DETAILED DESCRIPTION OF THE INVENTION

Figure 1:
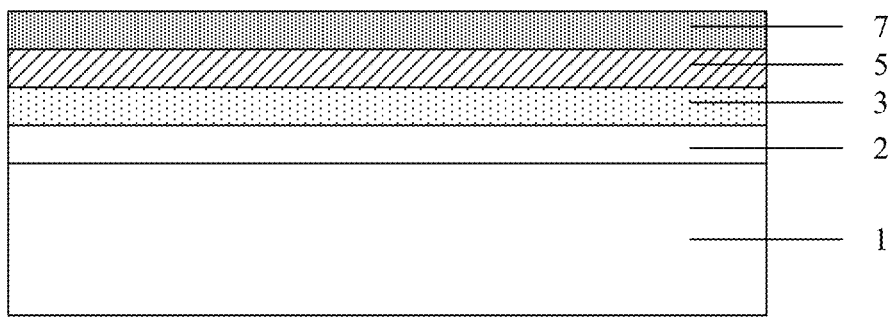
FIG. 1 is a structural schematic view of a conductive laminated structure in an embodiment of the present application.
Figure 2:
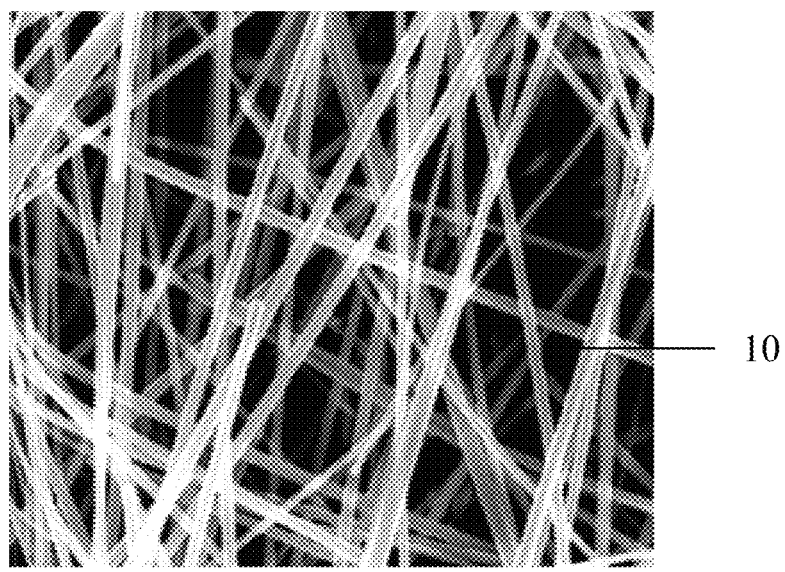
FIG. 2 is a microscopic morphology diagram of metal nanowires.

Transparent conducting material is usually deposited by a sputtering process at a high manufacturing temperature, the rare metal contained therein makes it expensive in price, and this kind of thin film made of ITO is easily fractured when being bent, thus being not suitable for producing a flexible device, these factors cause many restrictions on the performance and yield of ITO. Therefore, someone in the industry proposes metal nanowires, such as silver nano-wires (SNW) 10 (as shown in FIG. 2), to replace ITO as the conducting material for producing a transparent conductor. In comparison with ITO, metal nanowires not only have favorable optical, electrical and mechanical properties, but also have characteristics such as large surface area and quantum size effect. But, the currently used metal nanowires have poor adhesive force, and the bezel formed with metal nanowires is relatively wide.

Hereinafter, more detailed description of the conductive laminated structure of the present application and its manufacturing method will be given in conjunction with the schematic drawings.

In the description below, it should be understood that, when a layer (or film), an area, a pattern or a structure is described to be "on" a substrate, another layer (or film), another area and/or another pattern, it may be directly disposed on the other layer or the substrate, and/or there may be an interposing layer. Also, it should be understood that, when a layer is described to be "under" another layer, it may be directly disposed under the other layer, and/or there may be one or more interposing layers. Also, the references of "on" a layer and "under" a layer may be based on the appended drawings.

Figure 3:
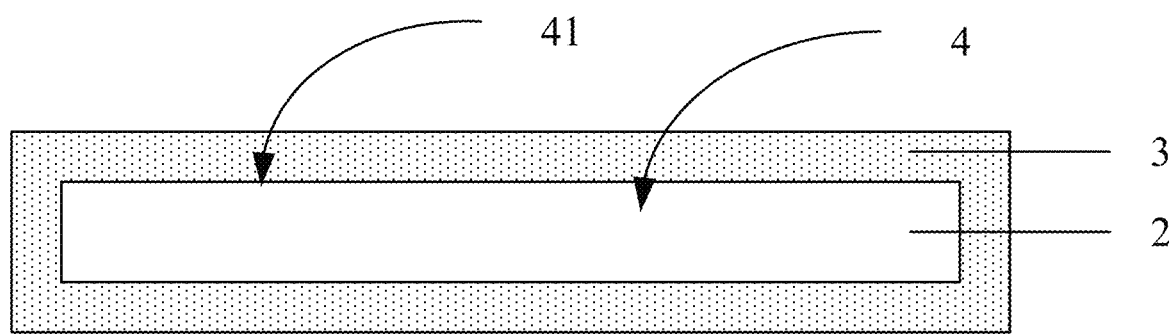
FIG. 3 is a partial top view of the metal nanowire layer in an embodiment of the present application.
Figure 4:
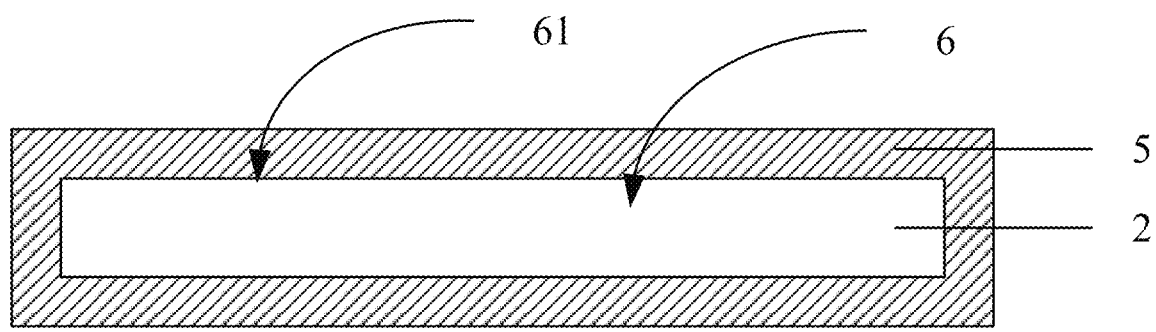
FIG. 4 is a partial top view of the wiring layer in an embodiment of the present application.
Figure 5:
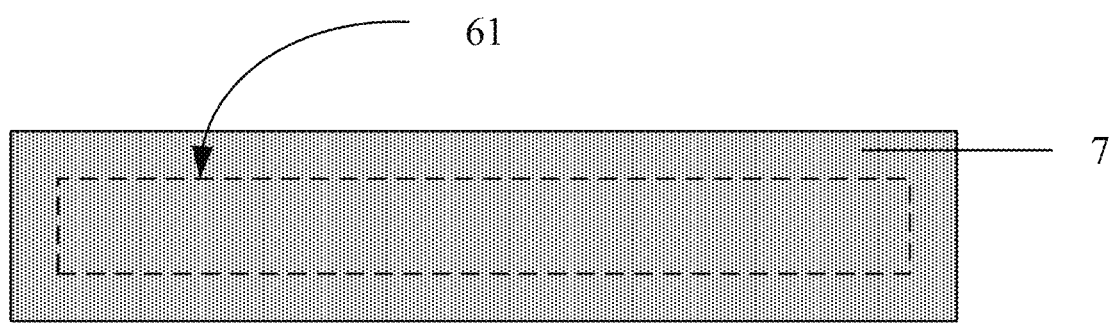
FIG. 5 is a partial top view of the optical adhesive layer in an embodiment of the present application.

As shown in FIG. 1 to FIG. 5, the embodiments of the present application provide a conductive laminated structure, comprising:

a substrate 1;

an adhesion enhancement layer 2, disposed on the substrate;

a metal nanowire layer 3, disposed on the adhesion enhancement layer 2 and having a first opening 4 (as shown in FIG. 3) to expose the adhesion enhancement layer 2;

a wiring layer 5, disposed on the metal nanowire layer 3 and having a second opening 6 (as shown in FIG. 4) at least partially overlapping the first opening 4 to expose the adhesion enhancement layer 2; and an optical adhesive layer 7, disposed on the wiring layer 5, filled in the second opening 6 and the first opening 4 and connected to the adhesion enhancement layer 2.

In an embodiment, the number of the first opening 4 and the second opening 6 is not limited to one, and may be more. A person skilled in the art may adjust the number of the first opening 4 and the second opening 6 according to actual needs.

In an embodiment, the first opening 4 exactly coincides with the second opening 6, that is to say, the first opening 4 has an area equal to that of the second opening 6 and has a boundary consistent with that of the second opening 6 (the two openings have identical shape, size and boundary). This helps to optimize the manufacturing process by saving masks and reducing cost.

In an embodiment, the first opening 4 and the second opening 6 may form a stepped shape, specifically, for example:

The second opening 6 has an area larger than that of the first opening 4; the first opening 4 falls within the scope of the second opening 6;

Or, the second opening 6 has an area smaller than that of the first opening 4; the second opening 6 falls within the scope of the first opening 4;

Or, at least part of the first opening 4 is misaligned with at least part of the second opening 6.

Therefore, by means of the stepped shape design of the first opening 4 and the second opening 6, the bonding area of the optical adhesive layer 7 with the metal nanowire layer 3 and the wiring layer 5 can be increased, thereby increasing the bonding force to better increase the adhesive force for the metal nanowire layer 3.

Multiple metal nanowire layers 3 are formed on the substrate, each of the metal nanowire layers 3 has an annular shape (including a rectangular ring or a circular ring) from a top view of the substrate 1, and the annular shape has a central opening that forms the first opening. A display panel (such as a touch control panel) has a wiring region, a plurality of the metal nanowire layers 3 are disposed in the wiring region and aligned in an extending direction of the wiring region, wherein the metal nanowire layers 3 are used for forming a contact electrical connection with the wiring layer 5, so as to conductively interconnect the wiring layer 5 and other electrical conducting structures; wherein the annular shape has an edge width of 0.5 µm-1.2 µm, which helps to realize a design of a narrow bezel.

In an embodiment, the adhesion enhancement layer has a thickness of 10 nm-300 nm.

Figure 6:
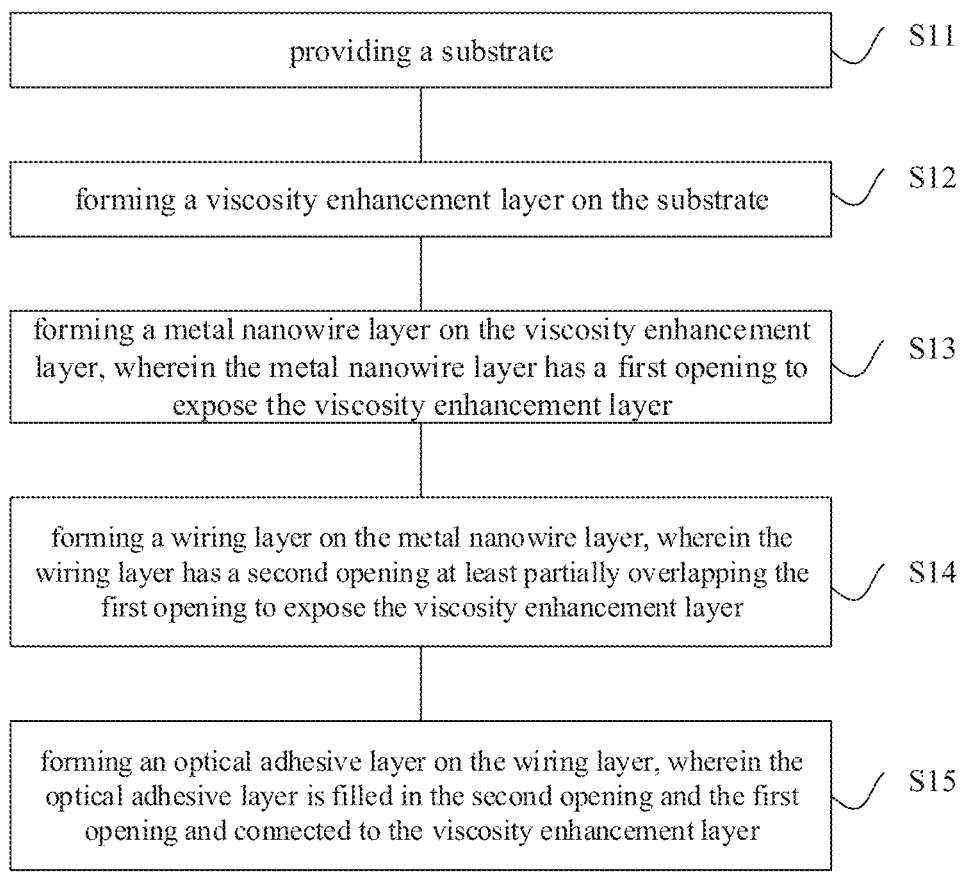
FIG. 6 is a flow chart of a method for manufacturing a conductive laminated structure in an embodiment of the present application.

Furthermore, as shown in FIG. 6, the embodiments of the present application also provide a method for manufacturing a conductive laminated structure, comprising:

Step S11, providing a substrate;

Step S12, forming an adhesion enhancement layer on the substrate;

Step S13, forming a metal nanowire layer on the adhesion enhancement layer;

Step S14, forming a wiring layer on the metal nanowire layer; and

Step S15, forming an optical adhesive layer on the wiring layer;

wherein the metal nanowire layer has a first opening to expose the adhesion enhancement layer, the wiring layer has a second opening at least partially overlapping the first opening to expose the adhesion enhancement layer, and the optical adhesive layer is filled in the second opening and the first opening and connected to the adhesion enhancement layer.

By using the method above, because the metal nanowire layer is in direct contact with the wiring layer, the conducting capability is enhanced, and a reduced contacting area is needed, so that the wiring layer can be relatively narrow, and the design of a narrow bezel can be realized; in the meantime, by means of the adhesion enhancement layer, the adhesive force of the metal nanowire layer can be increased, and with the optical adhesive layer disposed in the openings, the fixing effect to the metal nanowire layer can also be increased, thereby also increasing the adhesive force.

Hereinafter, preferable embodiments of the conductive laminated structure and its manufacturing method will be listed, in order to clearly describe the subject matter of the present application. It should be clarified that, the subject matter of the present application is not limited to the following embodiments, and other improvements made by a person skilled in the art using ordinary technical means are also included in the conceptual scope of the present application.

Figure 7:
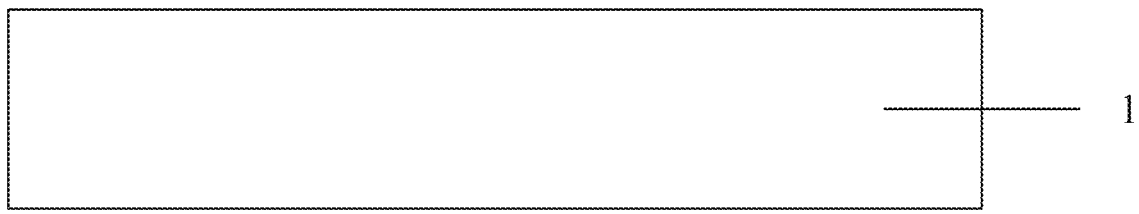
FIG. 7 is a sectional view of providing a substrate in an embodiment of the present application.

Referring to FIG. 7, as for Step S11, a substrate 1 is provided. In an embodiment, the substrate 1 may be a substrate made of rigid materials, such as a glass substrate, a silicon substrate, a metal substrate, etc. In an embodiment, the substrate 1 may also be a substrate made of flexible materials, wherein the material of the substrate 1 may be, but is not limited to, acryl, polymethyl methacrylate (PMMA), polyacrylonitrile butadiene styrene (ABS), polyamide (PA), polyimide (PI), polybenzimidazole polybutene (PB), polybutylene terephthalate (PBT), polycarbonate (PC), polyether ether ketone (PEEK), polyether imide (PEI), polyether sulfone (PES), polyethylene (PE), polyethylene terephthalate (PET), polyethylene tetrafluoroethylene (ETFE), polyepoxyethane, polyethylene glycolic acid (PGA), polymethyl-pentene (PMP), polyformaldehyde (POM), polyphenylene ether (PPE), polypropylene (PP), polystyrene (PS), polytetrafluoroethylene (PTFE), polyurethane (PU), polyvinyl chloride (PVC), polyvinyl fluoride (PVF), polyvinylidene chloride (PVDC), polyvinylidene fluoride (PVDF) or styrene-acrylonitrile (SAN). In the present embodiment, the substrate 1 is, for instance, a polyimide substrate. The substrate 1 of the present application is not limited to the above-listed examples, and may also be made of other materials.

It may be understood that, in a preferable scheme, the substrate 1 is pretreated to remove impurities such as microparticles, organics and metal ions thereon.

Figure 8:
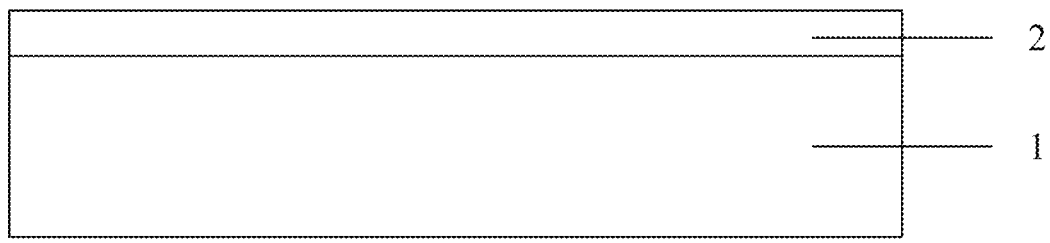
FIG. 8 is a sectional view of forming an adhesion enhancement layer in an embodiment of the present application.

Referring to FIG. 8, as for Step S12, an adhesion enhancement layer 2 is formed on the substrate 1.

For example, the adhesion enhancement layer 2 has a thickness of 10 nm-300 nm.

The material of the adhesion enhancement layer 2 may be selected from high-molecular polymer, insulation material, resin, transparent optical adhesive, oxides, and photoresist analogues, including but not limited to: polyvinyl alcohol, polyvinyl butyral, polyacetylene, polyaniline, polyarylate, polythiophene, graphene, pentacene, polyphenylene ether (PPE), poly(p-phenylene)acetylene (PPV), poly(3,4-ethylene)dioxophene (PEDOT), polystyrene sulfonic acid (PSS), poly(3-hexyl)thiophene (P3HT), poly(3-octyl)thiophene (P3OT), poly(C-61-butyric-acid-methyl-ester) (PCBM), poly[2-methoxy-5-(2-ethyl-hexoxy)-1,4-phenylene ethylene] (MEH-PPV), silicon nitride, silicon dioxide.

Figure 9:
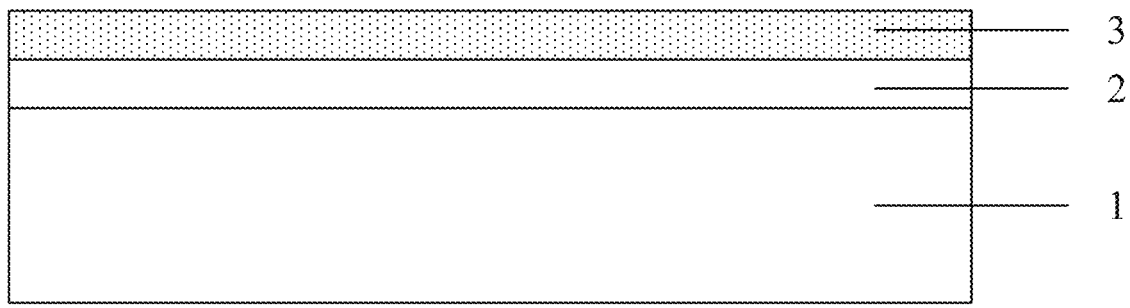
FIG. 9 is a sectional view of forming a metal nanowire layer in an embodiment of the present application.
Figure 10:
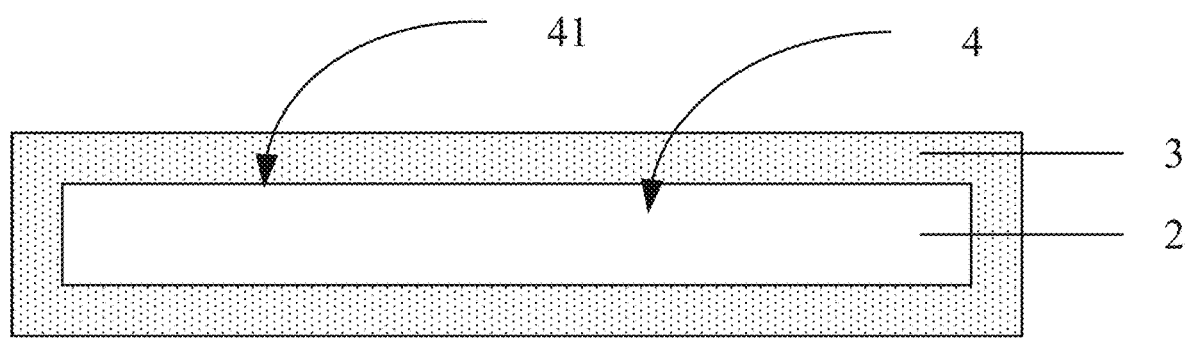
FIG. 10 is a top view of forming a metal nanowire layer in an embodiment of the present application.

Then, referring to FIG. 9 and FIG. 10, as for Step S13, a metal nanowire layer 3 is formed on the adhesion enhancement layer 2, wherein the metal nanowire layer 3 has a first opening 4 to expose the adhesion enhancement layer 2.

In an embodiment, the number of the first opening 4 is not limited to one, and may be more. A person skilled in the art may adjust the number of the first opening 4 according to actual needs.

The adhesive force between the adhesion enhancement layer 2 and the substrate 1 is larger than the adhesive force between the substrate 1 and the metal nanowire layer 3, and the adhesive force between the adhesion enhancement layer 2 and the metal nanowire layer 3 is also larger than the adhesive force between the substrate 1 and the metal nanowire layer 3, therefore, the adding of the adhesion enhancement layer 2 may allow the metal nanowire layer 3 to better adhere to the substrate 1, so that the metal nanowire layer 3 is not easy to wobble or shift, and a firmer lap joint can be realized.

Referring to FIG. 10, the first opening 4 has a first opening boundary 41. For example, the first opening boundary 41 has a rectangular shape, a circular shape, etc.; multiple metal nanowire layers 3 are formed on the substrate 1, each of the metal nanowire layers 3 has an annular shape (including a rectangular ring or a circular ring) from a top view of the substrate 1. A display panel (such as a touch control panel) has a wiring region, a plurality of the metal nanowire layers 3 are disposed in the wiring region and aligned in an extending direction of the wiring region; wherein the annular shape has an edge width of 0.5 μm-1.2 μm, for example, 0.8 μm, 0.9 μm, 1 μm, etc., so as to realize a design of narrow bezel.

This step (Step S13) may specifically comprise:

Firstly, coating a solution of metal nanowires. The solution of metal nanowires has a plurality of metal nanowires distributed in a solvent. The solution of metal nanowires has a concentration of 0.01 mg/mL-10 mg/mL, for example, 0.05 mg/mL, 0.1 mg/mL, 0.5 mg/mL, 1 mg/mL, 2 mg/mL, 3 mg/mL, 4 mg/mL, 5 mg/mL, 6 mg/mL, 7 mg/mL, 8 mg/mL, 9 mg/mL, etc., and a person skilled in the art may flexibly select the concentration of the solution of metal nanowires according to actual process capability and product demands.

The solvent may be water, water solution, organic solution, inorganic solution, ionic solution, salt-containing solution, supercritical fluid, oil, or a mixture thereof. The solvent may contain other additives, such as a dispersing agent, a surfactant, a crosslinking agent, a wetting agent, and a thickening agent, but it is not limited to these.

The metal nanowires in the solution of metal nanowires may be nanowires of gold (Au), silver (Ag), platinum (Pt), copper (Cu), cobalt (Co), palladium (Pd). Because silver has characteristics of good electrical conductivity and light transmittance, the metal nanowires are preferably nanowires of silver (i.e., silver nano-wires 10, as shown in FIG. 2); accordingly, the solution of metal nanowires is preferably a solution of silver nano-wires.

The coating of the solution of metal nanowires may be carried out by using prior art techniques. For example, the coating method includes but not limited to: inkjet, spreading, gravure printing, embossed printing, flexographic printing, nano-imprinting, screen printing, scraper coating, spin coating, stylus plotting, seam coating or flow coating.

Subsequently, drying to evaporate the solvent of the solution of metal nanowires, thereby obtaining a metal nanowire material layer.

The drying method may be natural drying, simple baking or heating curing. In an embodiment, the drying may be performed by vacuum decompression, infrared heating or hot air heating, and the drying lasts for a duration of 50 s-100 s, for example, 55 s, 60 s, 70 s, etc.

Then, etching the metal nanowire material layer to form the first opening 4 to expose the adhesion enhancement layer 2, so as to form the metal nanowire layer 3.

The etching may be performed by a laser etching process, or other feasible operations, which is not elaborated in detail herein.

Figure 11:
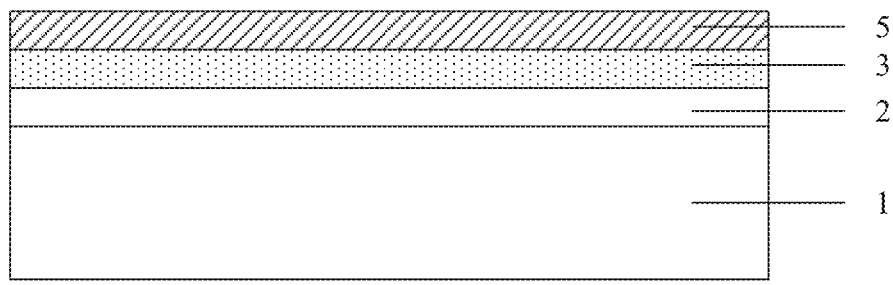
FIG. 11 is a sectional view of forming a wiring layer in an embodiment of the present application.
Figure 12:
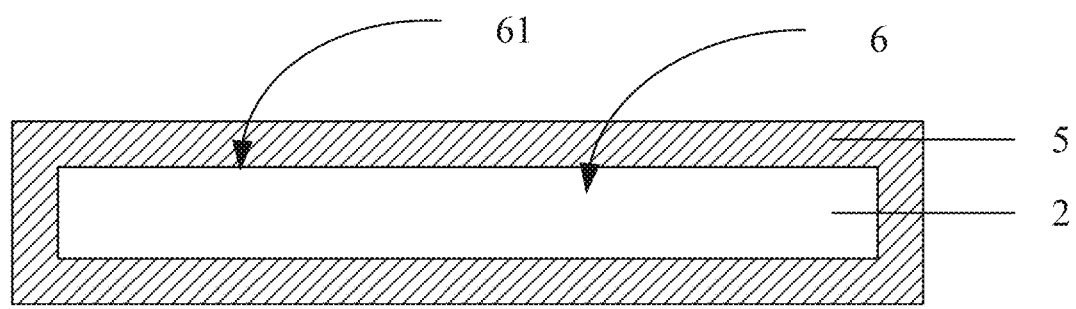
FIG. 12 is a top view of forming a wiring layer in an embodiment of the present application.

Referring to FIG. 11 and FIG. 12, as for Step S14, a wiring layer 5 is formed on the metal nanowire layer 3, wherein the wiring layer 5 has a second opening 6 at least partially overlapping the first opening 4 to expose the adhesion enhancement layer 2.

In an embodiment, the number of the second openings 6 is not limited to one, and may be more. A person skilled in the art may adjust the number of the second openings 6 according to actual needs.

For example, the wiring layer 5 may be exactly overlapping the metal nanowire layer 3.

The second opening 6 has a second opening boundary 61 which may be consistent with the first opening boundary 41. Accordingly, the second opening 6 may be consistent with the first opening 4, that is to say, the first opening 4 exactly coincides with the second opening 6, due to the fact that the two openings have identical shape, size and boundary. This helps to optimize the manufacturing process by saving masks and reducing cost.

It may be understood that, the second opening boundary 61 may not be completely consistent with the first opening boundary 41, for example, the second opening boundary 61 may fall onto the metal nanowire layer 3.

In an embodiment, the first opening 4 and the second opening 6 may form a stepped shape, specifically, for example:

The second opening 6 has an area larger than that of the first opening 4; the first opening 4 falls within the scope of the second opening 6;

Or, the second opening 6 has an area smaller than that of the first opening 4; the second opening 6 falls within the scope of the first opening 4;

Or, at least part of the first opening 4 is misaligned with at least part of the second opening 6.

Therefore, by means of the stepped shape design of the first opening 4 and the second opening 6, the bonding area of the subsequently-formed optical adhesive layer 7 (referring to FIG. 13) with the metal nanowire layer 3 and the wiring layer 5 can be increased, thereby increasing the bonding force to better increase the adhesive force for the metal nanowire layer 3.

Because the wiring layer 5 is in direct contact with the metal nanowire layer 3, the contacting electrical resistance can be reduced and the conducting capability can be enhanced, so that a relatively small contacting area can be used to realize electrical conducting, which is beneficial for a design of narrow bezel.

Figure 13:
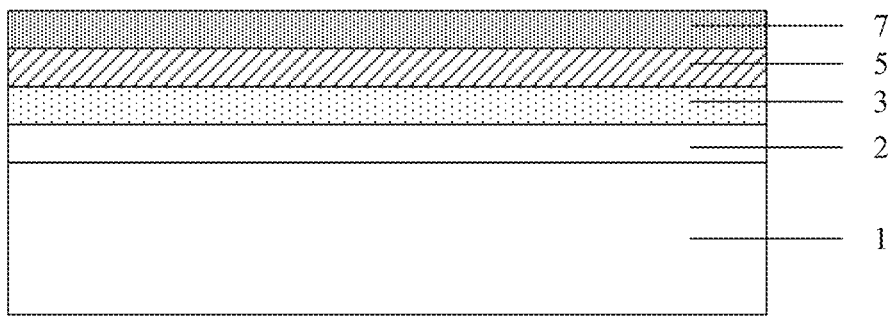
FIG. 13 is a sectional view of forming an optical adhesive layer in an embodiment of the present application.
Figure 14:
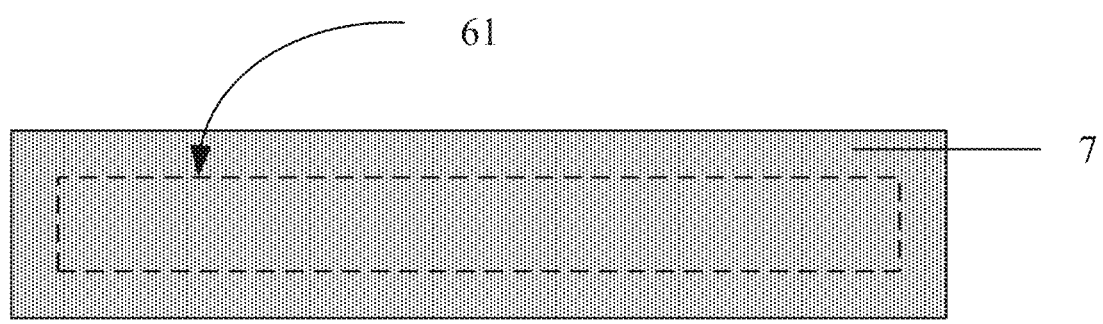
FIG. 14 is a top view of forming an optical adhesive layer in an embodiment of the present application.

Referring to FIG. 13 and FIG. 14, as for Step S15, an optical adhesive layer 7 is formed on the wiring layer 5, wherein the optical adhesive layer 7 is filled in the second opening and the first opening and connected to the adhesion enhancement layer. The second opening boundary 61 is shown by a dashed line frame in FIG. 14, so that the particular position and structure of the optical adhesive layer 7 in the present application can be better understood.

Moreover, the embodiments of the present application also provide a display panel which comprises the aforementioned conductive laminated structure.

The display panel may be applied in any product or component with a display function, such as a cellphone, a tablet computer, a TV set, a display device, a notebook computer, a digital photo frame, a GPS navigator.

The embodiments of the present application also provide a touch control panel which comprises the aforementioned conductive laminated structure.

The touch control panel may be applied in any product or component with a touch control operation function, such as a cellphone, a tablet computer, a TV set, a display device, a notebook computer, a digital photo frame, a GPS navigator.

The display panel, for example, may comprise the touch control panel.

The embodiments of the present application also provide a display device which comprises the aforementioned conductive laminated structure. For example, the display device may be any product or component with a display function, such as a cellphone, a tablet computer, a TV set, a display device, a notebook computer, a digital photo frame, a GPS navigator.

In summary, the conductive laminated structure provided by the present application comprises a substrate; an adhesion enhancement layer disposed on the substrate; a metal nanowire layer disposed on the adhesion enhancement layer and having a first opening to expose the adhesion enhancement layer; a wiring layer disposed on the metal nanowire layer and having a second opening at least partially overlapping the first opening to expose the adhesion enhancement layer; and an optical adhesive layer disposed on the wiring layer, filled in the second opening and the first opening and connected to the adhesion enhancement layer. Because the metal nanowire layer is in direct contact with the wiring layer, the conducting capability is enhanced, and it only needs a contacting area of 0.1 mm$^2$ or smaller, which reduces the contacting area, in comparison with the contacting area of larger than 0.25 mm$^2$ in prior art, therefore, the wiring layer can be relatively narrow, so that the design of a narrow bezel is realized; in the meantime, by means of the adhesion enhancement layer, the adhesive force of the metal nanowire layer can be increased, and with the optical adhesive layer disposed in the openings, the fixing effect to the metal nanowire layer can also be increased, thereby also increasing the adhesive force.

Furthermore, by adjusting the sizes of and the positional relationship between the first opening and the second opening, a stepped shape can be formed with the first opening and the second opening, so as to increase the bonding area of the optical adhesive layer with the metal nanowire layer and the wiring layer, thereby increasing the bonding force to better increase the adhesive force for the metal nanowire layer.

Apparently, a person skilled in the art may make various changes and modifications to the present application without departing from the concept and scope of the present application. Thus, if these changes and modifications belong to the scope of the Claims of the present application and equivalent technology thereof, the present application is also intended to include these changes and modifications.

The invention claimed is:

1. A conductive laminated structure, comprising:
   a substrate;
   an adhesion enhancement layer, disposed on the substrate;
   a metal nanowire layer, disposed on the adhesion enhancement layer and having at least one first opening to expose the adhesion enhancement layer;
   a wiring layer, disposed on the metal nanowire layer and having at least one second opening at least partially overlapping the at least one first opening to expose the adhesion enhancement layer; and
   an optical adhesive layer, disposed on the wiring layer, filled in the at least one second opening and the at least one first opening and connected to the adhesion enhancement layer.

2. The conductive laminated structure according to claim 1, wherein, the at least one second opening has an area larger than that of the at least one first opening; the at least one first opening falls within the scope of the at least one second opening.

3. The conductive laminated structure according to claim 1, wherein, the at least one second opening has an area smaller than that of the at least one first opening, and the at least one second opening falls within the scope of the at least one first opening.

4. The conductive laminated structure according to claim 1, wherein, at least part of the at least one first opening is misaligned with at least part of the at least one second opening.

5. The conductive laminated structure according to claim 1, wherein, the at least one first opening has an area equal to that of the at least one second opening, and the at least one first opening has a boundary in alignment with that of the at least one second opening.

6. The conductive laminated structure according to claim 1, wherein, the substrate has a plurality of portions of the metal nanowire layer formed thereon, each of the portions of the metal nanowire layer has an annular shape from a top view of the substrate, and the annular shape has a central opening that forms each of the at least one first opening.

7. The conductive laminated structure according to claim 6, wherein, the annular shape has an edge width of 0.5 μm-1.2 μm.

8. The conductive laminated structure according to claim 1, wherein, the adhesion enhancement layer has a thickness of 10 nm-300 nm.

9. The conductive laminated structure according to claim 1, wherein the at least one first opening comprises a plurality of first openings and the at least one second opening comprises a plurality of second openings.

10. The conductive laminated structure according to claim 1, wherein, the adhesion enhancement layer is made of at least one material selected from high-molecular polymer, insulation material, resin, transparent optical adhesive, oxides, and photoresist analogues.

11. The conductive laminated structure according to claim 10, wherein, the adhesion enhancement layer has a thickness of 10 nm-300 nm.

12. A method for manufacturing a conductive laminated structure, comprising:
    providing a substrate;
    forming an adhesion enhancement layer on the substrate;
    forming a metal nanowire layer on the adhesion enhancement layer;
    forming a wiring layer on the metal nanowire layer; and
    forming an optical adhesive layer on the wiring layer;
    wherein the metal nanowire layer has at least one first opening to expose the adhesion enhancement layer, the wiring layer has at least one second opening at least partially overlapping the at least one first opening to expose the adhesion enhancement layer, and the optical adhesive layer is filled in the at least one second opening and the at least one first opening and connected to the adhesion enhancement layer.

13. The method according to claim 12, wherein, the step of forming the metal nanowire layer on the adhesion enhancement layer comprises:
    coating a solution of metal nanowires;
    drying to evaporate a solvent of the solution of metal nanowires, thereby obtaining a metal nanowire material layer;
    etching the metal nanowire material layer to form the at least one first opening to expose the adhesion enhancement layer, so as to form the metal nanowire layer.

14. The method according to claim 13, wherein, the solution of metal nanowires has a plurality of metal nanowires distributed in the solvent.

15. The method according to claim 13, wherein, the solution of metal nanowires has a concentration of 0.01 mg/mL-10 mg/mL.

16. The method according to claim 14, wherein, the solvent is any one of water, ionic solution, salt-containing solution, supercritical fluid, and oil.

17. The method according to claim 16, wherein, the solvent contains at least one of a dispersing agent, a surfactant, a crosslinking agent, a wetting agent, and a thickening agent.

18. The method according to claim 13, wherein, in the step of drying to evaporate the solvent of the solution of metal nanowires, the drying is performed by vacuum decompression, infrared heating or hot air heating, and the drying lasts for a duration of 50 s-100 s.

19. A display panel, comprising a conductive laminated structure according to claim 1.

20. The display panel according to claim 19, wherein, the display panel comprises a wiring region, a plurality of portions of the metal nanowire layer are disposed in the wiring region and aligned in an extending direction of the wiring region.

\* \* \* \* \*